US011329558B2

(12) United States Patent
Xie et al.

(10) Patent No.: US 11,329,558 B2
(45) Date of Patent: May 10, 2022

(54) SWITCHED-CAPACITOR DC-DC VOLTAGE CONVERTER AND CONTROL METHOD THEREOF

(71) Applicant: National Taiwan University, Taipei (TW)

(72) Inventors: Fu-Yan Xie, Tainan (TW); Bing-Chen Wu, Taibao (TW); Tsung-Te Liu, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 16/984,577

(22) Filed: Aug. 4, 2020

(65) Prior Publication Data
US 2022/0014098 A1   Jan. 13, 2022

(30) Foreign Application Priority Data

Jul. 9, 2020   (TW) .................................. 109123183

(51) Int. Cl.
*H02M 3/158*       (2006.01)
*H02M 3/07*        (2006.01)
*H03K 19/20*       (2006.01)
*G06F 1/10*        (2006.01)
*H03K 3/286*       (2006.01)

(52) U.S. Cl.
CPC .............. *H02M 3/158* (2013.01); *G06F 1/10* (2013.01); *H02M 3/07* (2013.01); *H03K 3/286* (2013.01); *H03K 19/20* (2013.01)

(58) Field of Classification Search
CPC ........ H02M 3/158; H02M 3/07; H03K 3/286; H03K 19/20; G06F 1/10
See application file for complete search history.

(56) References Cited

U.S. PATENT DOCUMENTS

2017/0317595 A1*  11/2017  Babazadeh ....... H02M 3/33592

OTHER PUBLICATIONS

Piqué, "A 41-phase switched-capacitor power converter with 3.8mV output ripple and 81% efficiency in baseline 90nm CMOS", 2012 IEEE International Solid-State Circuits Conference, Feb. 2012, p. 98-p. 100.
Kwong et al., "A 65 nm Sub-Vt Microcontroller With Integrated SRAM and Switched Capacitor DC-DC Converter", IEEE Journal of Solid-State Circuits, Jan. 2009, p. 115-p. 126. Volume: 44, Issue: 1.

(Continued)

*Primary Examiner* — Sibin Chen
(74) *Attorney, Agent, or Firm* — Chen Yoshimura LLP

(57) ABSTRACT

A switched-capacitor DC-DC voltage converter and a control method thereof. The switched-capacitor DC-DC voltage converter comprises at least one switch array, comprising a capacitor and at least one switch group, wherein the switch group comprises a plurality of power switches connected to one another in parallel, and one end of the capacitor is electrically connected to the switch group; and a control circuit, converting an input control signal into a control signal set, and outputting the control signal set to the switch group, and the control signal set comprises a plurality of control signals with phase delayed sequentially and the duty cycle reduced sequentially.

16 Claims, 8 Drawing Sheets

(56) References Cited

OTHER PUBLICATIONS

Bang et al., "A Low Ripple Switched-Capacitor Voltage Regulator Using Flying Capacitance Dithering", IEEE Journal of Solid-State Circuits, Apr. 2016, p. 919-p. 929, vol. 51, Issue: 4.

Lu et al., "A Multiphase Switched-Capacitor DC-DC Converter Ring With Fast Transient Response and Small Ripple", IEEE Journal of Solid-State Circuits, Feb. 2017, p. 579-p. 591, Feb. 2017, vol. 52, Issue: 2.

Kilani et al., "An Efficient Switched-Capacitor DC-DC Buck Converter for Self-Powered Wearable Electronics, IEEE Transactions on Circuits and Systems I: Regular Papers", Oct. 2016, p. 1557-p. 1566. Volume: 63, Issue: 10.

Jain et al., "Conductance modulation techniques in switched-capacitor DC-DC converter for maximum-efficiency tracking and ripple mitigation in 22nm Tri-gate CMOS", Sep. 2014, Proceedings of the IEEE 2014 Custom Integrated Circuits Conference.

Le et al., "Design Techniques for Fully Integrated Switched-Capacitor DC-DC Converters", IEEE Journal of Solid-State Circuits, Sep. 2011, p. 2120-p. 2131, vol. 46, Issue: 9.

Jiang et al., "Digital 2-/3-Phase Switched-Capacitor Converter With Ripple Reduction and Efficiency Improvement", IEEE Journal of Solid-State Circuits, Jul. 2017, p. 1836-p. 1848. Volume: 52, Issue: 7.

Seeman, "A Design Methodology for Switched-Capacitor DC-DC Converters", May 21, 2009, Electrical Engineering and Computer Sciences, University of California at Berkeley.

Bukreyev et al., "Four Monolithically Integrated Switched-Capacitor DC-DC Converters With Dynamic Capacitance Sharing in 65-nm CMOS", IEEE Transactions on Circuits and Systems I: Regular Papers, Jun. 2018, p. 2035-p. 2047, vol. 65, Issue: 6.

Kudva et al., "Fully Integrated Capacitive DC-DC Converter With All-Digital Ripple Mitigation Technique", IEEE Journal of Solid-State Circuits, Aug. 2013, vol. 48, Issue: 8.

Xie et al., "A Ripple Reduction Method for Switched-Capacitor DC-DC Voltage Converter Using Fully Digital Resistance Modulation", IEEE Transactions on Circuits and Systems 1: Regular Papers, Sep. 2019, p. 3631-p. 3641, vol. 66, Issue: 9.

\* cited by examiner

SWITCHED-CAPACITOR DC-DC VOLTAGE CONVERTER AND CONTROL METHOD THEREOF

CROSS-REFERENCE TO RELATED APPLICATIONS

This application claims priority to R.O.C. Patent Application No. 109123183 titled "Switched-capacitor dc-dc voltage converter and control method thereof," filed on Jul. 9, 2020, with the Taiwan Intellectual Property Office (TWO).

TECHNICAL FIELD

The present disclosure relates to a voltage converter, and particularly, to a switched-capacitor dc-dc voltage converter and control method thereof.

BACKGROUND

Low power consumption is an important feature for current microprocessors and consumer electronics product. In the future, most of the microprocessors or IC used in the Internet of Things will operate with light loads current output range. Therefore, the design of light load and high efficiency will be one of the design priorities of the switched-capacitor DC-DC converter as the power circuit.

Take a conventional switched-capacitor DC-DC voltage converter as an example, a conventional switched-capacitor DC-DC voltage converter 1 with a conversion ratio of 2:1 as shown in FIG. 1A. The witched-capacitor DC-DC voltage converter 1 comprises a voltage source $V_{in}$, a switch circuit 10, a capacitor C, and a load resistor $R_{L1}$. The switch circuit 10 comprises a first switch SW1, a second switch SW2, a third switch SW3, and a fourth switch SW4. One terminal of the capacitor 1 is electrically connected to the first switch SW1 and the second switch SW2. Another terminal of the capacitor C is electrically connected to the third switch SW3 and the fourth switch SW4. The second switch SW2 is electrically connected to the third switch SW3. First clock control signal $\phi_1$ and second clock control signal $\phi_2$ (as shown in FIG. 1B) are generated by a clock generator (not shown). The first clock control signal $\phi_1$ and second clock control signal $\phi_2$ have phase difference of $\pi/2$ between them and the same cycle time T. The first clock control signal $\phi_1$ is outputted to the first switch SW1 and the third switch SW3, and the second clock control signal $\phi_2$ is outputted to the second switch SW2 and the fourth switch SW4 to control the capacitor C to charge and discharge periodically. However, the cross-voltage amplitude $\Delta V_{out}$ of the output voltage $V_{out}$ across the load resistor $R_u$ of the conventional switched-capacitor DC/DC voltage converter 1 has a high output ripple (as shown in FIG. 1C), which seriously affected its energy efficiency, computing efficiency and operational robustness.

For those familiar with the field of switched-capacitor DC/DC converter, to produce different switched-capacitor DC/DC voltage converters with different conversion ratios, four terminals of the switch circuit 10 (comprising a first terminal P being the terminal of the first switch SW1 not connected to the capacitor C, a second terminal Q being the terminal of the second switch SW2 not connected to the capacitor C, a third terminal R being the terminal of the fourth switch SW4 not connected to the capacitor C, and a fourth terminal S being the terminal of the third switch SW3 not connected to the capacitor C) can be connected with other switch arrays or electrically connected to an input voltage, an output voltage, and a ground as shown in FIGS. 1D-1G. For different switched-capacitor DC/DC voltage converters with different conversion ratios, those familiar with this field should be able to simply assign multiple switches into switches controlled by the first clock control signal $\phi_1$ and switches controlled by the second clock control signal $\phi_2$.

Referring to FIG. 1H, FIG. 1H is a flow chart of a prior art of a design method of the switched-capacitor DC/DC voltage converter for reducing the output ripple. The design method of the switched-capacitor DC/DC voltage converter comprises specifying an input voltage $V_{in}$, an expected output voltage, an expected output current, and an expected output ripple amplitude (S101); adjusting a switching frequency $f_{sw}$ of an control signal for the switches, the size of the switches and the capacitors (S103); and determining whether an output voltage $V_{out}$, an output current $I_{out}$, and a output ripple amplitude $\Delta V_{out}$ meet the expected output voltage, the expected output current, and the expected output ripple amplitude (S105). If the judgment is no, the adjustment of the switching frequency $f_{sw}$ of the control signal for the switch, the size of the switches and the capacitors (S103) is repeated until judged as yes. In general, if using the conventional control method to make the cross-voltage amplitude conform to the desired cross-voltage amplitude, the conversion efficiency of the switched-capacitor DC/DC voltage converter will be negatively affected.

In view of this, how to provide a switched-capacitor DC-DC power converter with low output ripple and high conversion efficiency is an important and valuable technology.

SUMMARY

One aspect of the present disclosure provides a switched-capacitor DC-DC voltage converter with low output ripple, which can improve energy usage efficiency, computing performance and operational robustness of the loading circuitry.

In order to achieve the above object, an embodiment of the present invention provides a switched-capacitor DC/DC voltage converter comprising at least one switch array and a control circuit. The switch array comprises a capacitor, a first switch group, a second switch group, a third switch group, and a fourth switch group, wherein each of the first, second, third, and fourth switch groups comprises a plurality of power switches connected to one another in parallel, one end of the capacitor is electrically connected to the first switch group and the second switch group, another end of the capacitor is electrically connected to the third switch group and the fourth switch group. The control circuit converts an input control signal to a first control signal set and a second control signal set, and outputs the first control signal set to the first and third switch groups and the second control signal set to the second and fourth switch groups, wherein each of the first control signal set and the second control signal set comprises a plurality of control signals with the phase delayed sequentially and the duty cycle reduced sequentially.

In some embodiments of the present disclosure, the power switches have the same area cost.

In some embodiments of the present disclosure, the power switches are field effect transistors.

In some embodiments of the present disclosure, the power switches have the same sizing ratio.

In some embodiments of the present disclosure, the number of the power switches of each of the first, second, third, and fourth switch groups is N, and the control circuit comprises:

a clock divider, dividing the control signal into N control signals with equal phase difference, comprising a first clock signal and N−1 control signals with equal phase difference;

a non-overlapping signal generator, converting the first clock signal into a first main clock control signal and a second main clock control signal; and an AND gate array, converting the first main clock control signal and the N−1 control signals with equal phase difference into the first control signal set, and converting the second main clock control signal and the N−1 control signals with equal phase difference into the second control signal set.

In some embodiments of the present disclosure, the clock divider comprises N flip-flops and an inverter.

In some embodiments of the present disclosure, the non-overlapping signal generator comprises an inverter, two NAND gates, and two delay units.

In some embodiments of the present disclosure, the AND gate array comprises 2(N−1) AND gates.

In some embodiments of the present disclosure, the number of the power switches of each of the first, second, third, and fourth switch groups is N, and a delay time between each of the signal members in the first and second control signal sets is ½N cycle time.

In some embodiments of the present disclosure, the number of the power switches of each of the first, second, third, and fourth switch groups is N, and duty cycles of each of the first and second control signal sets are sequentially reduced by 1/N duty cycle.

In order to achieve the above object, another embodiment of the present invention provides a control method of a switched-capacitor DC-DC voltage converter, wherein at least one switch array in the switched-capacitor DC-DC voltage converter is controlled by a control circuit, the switch array comprises a capacitor, a first switch group, a second switch group, a third switch group, and a fourth switch group, each of the first, second, third, and fourth switch groups comprises a plurality of power switches connected to one another in parallel, one end of the capacitor is electrically connected to the first switch group and the second switch group, another end of the capacitor is electrically connected to the third switch group and the fourth switch group, and the method comprises:

converting an input control signal into a first control signal set and a second control signal set; and outputting the first control signal set to the first and third switch groups and the second control signal set to the second and fourth switch groups, wherein each of the first control signal set and the second control signal set comprises a plurality of control signals with phase delayed sequentially and the duty cycle reduced sequentially.

In some embodiments of the present disclosure, the number of the power switches of each of the first, second, third, and fourth switch groups is N, and the step of converting the control signal into the first control signal set and the second control signal set comprises:

dividing an input control signal into N control signals with equal phase difference, comprising a first clock signal and N−1 control signals with equal phase difference;

converting the first clock signal into a first main clock control signal and a second main clock control signal; and converting the first main clock control signal and the N−1 control signals with equal phase difference into the first control signal set, and converting the second main clock control signal and the N−1 control signals with equal phase difference into the second control signal set.

In some embodiments of the present disclosure, the number of the power switches of each of the first, second, third, and fourth switch groups is N, and a delay time of each of the first and second control signal sets is ½N cycle time.

In some embodiments of the present disclosure, the number of the power switches of each of the first, second, third, and fourth switch groups is N, and duty cycles of each of the first and second control signal sets are sequentially reduced by 1/N duty cycle.

In order to achieve the above object, another embodiment of the present invention provides a switched-capacitor DC-DC voltage converter, which comprise:

at least one switch array, comprising a capacitor and at least one switch group, wherein the switch group comprises a plurality of power switches connected to one another in parallel, and one end of the capacitor is electrically connected to the switch group; and a control circuit, converting an input control signal into a control signal set, and outputting the control signal set to the switch group, and the control signal set comprises a plurality of signals with phase delayed sequentially and the duty cycle reduced sequentially.

In order to achieve the above object, another embodiment of the present invention provides a control method of a switched-capacitor DC-DC voltage converter, wherein at least one switch array in the switched-capacitor DC-DC voltage converter is controlled by a control circuit, the switch array comprises a capacitor, and at least one switch group, wherein the switch group comprises a plurality of power switches connected to one another in parallel, and one end of the capacitor is electrically connected to the switch group, and the method comprises: converting an input control signal into a first control signal set and a second control signal set; and outputting the first control signal set to the first and third switch groups and the second control signal set to the second and fourth discharge switch groups, wherein each of the first control signal set and the second control signal set comprises a plurality of control signals with phase delayed sequentially and the duty cycle reduced sequentially.

BRIEF DESCRIPTION OF THE DRAWINGS

Exemplary embodiments will be more readily understood from the following detailed description when read in conjunction with the appended drawings, in which.

DETAILED DESCRIPTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Figure 1A:
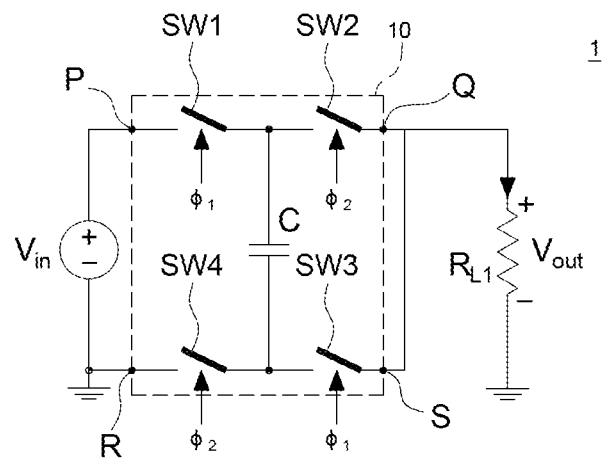
FIG. 1A is a schematic view illustrating a prior art of the switched-capacitor DC-DC voltage converter.
Figure 1B:
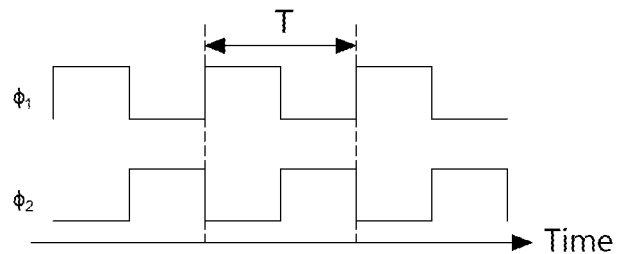
FIG. 1B is a timing diagram illustrating a clock control signal of a prior art of the switched-capacitor DC-DC voltage converter.
Figure 1C:
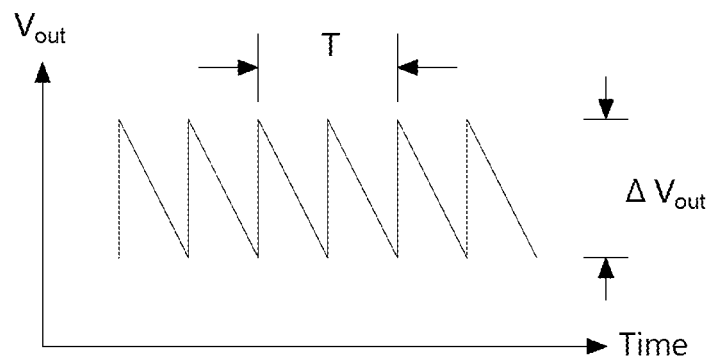
FIG. 1C is a timing diagram illustrating an output voltage of a prior art of the switched-capacitor DC-DC voltage converter.
Figure 1D:
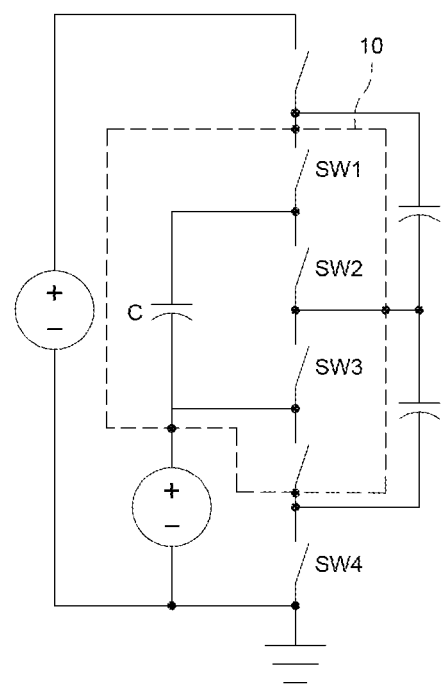
FIG. 1D is a circuit diagram illustrating a prior art of the switched-capacitor DC-DC voltage converter.
Figure 1E:
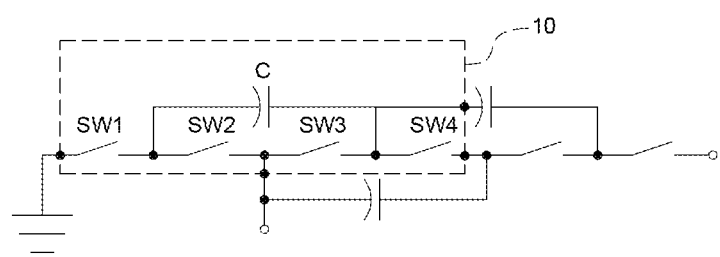
FIG. 1E is a circuit diagram illustrating a prior art of the switched-capacitor DC-DC voltage converter.
Figure 1F:
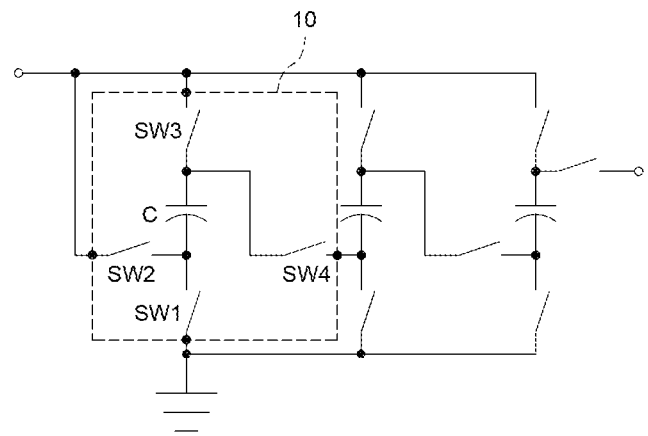
FIG. 1F is a circuit diagram illustrating a prior art of the switched-capacitor DC-DC voltage converter.
Figure 1G:
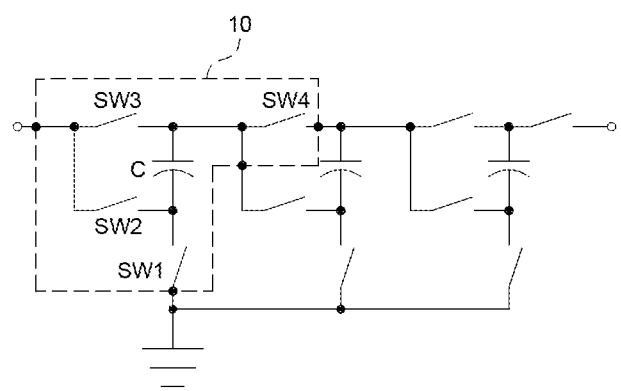
FIG. 1G is a circuit diagram illustrating a prior art of the switched-capacitor DC-DC voltage converter.
Figure 1H:
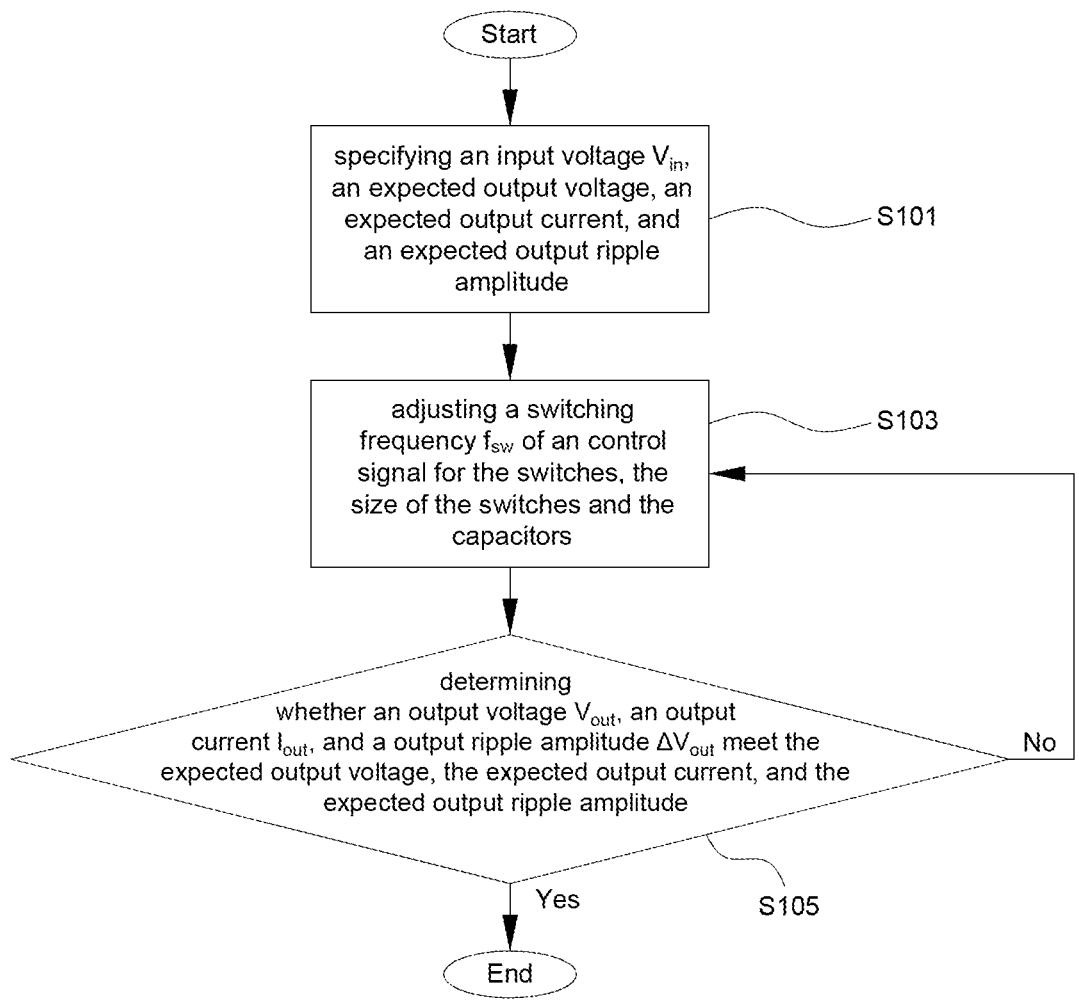
FIG. 1H is a flow chart illustrating a prior art of a design method of the switched-capacitor DC-DC voltage converter.
Figure 2A:
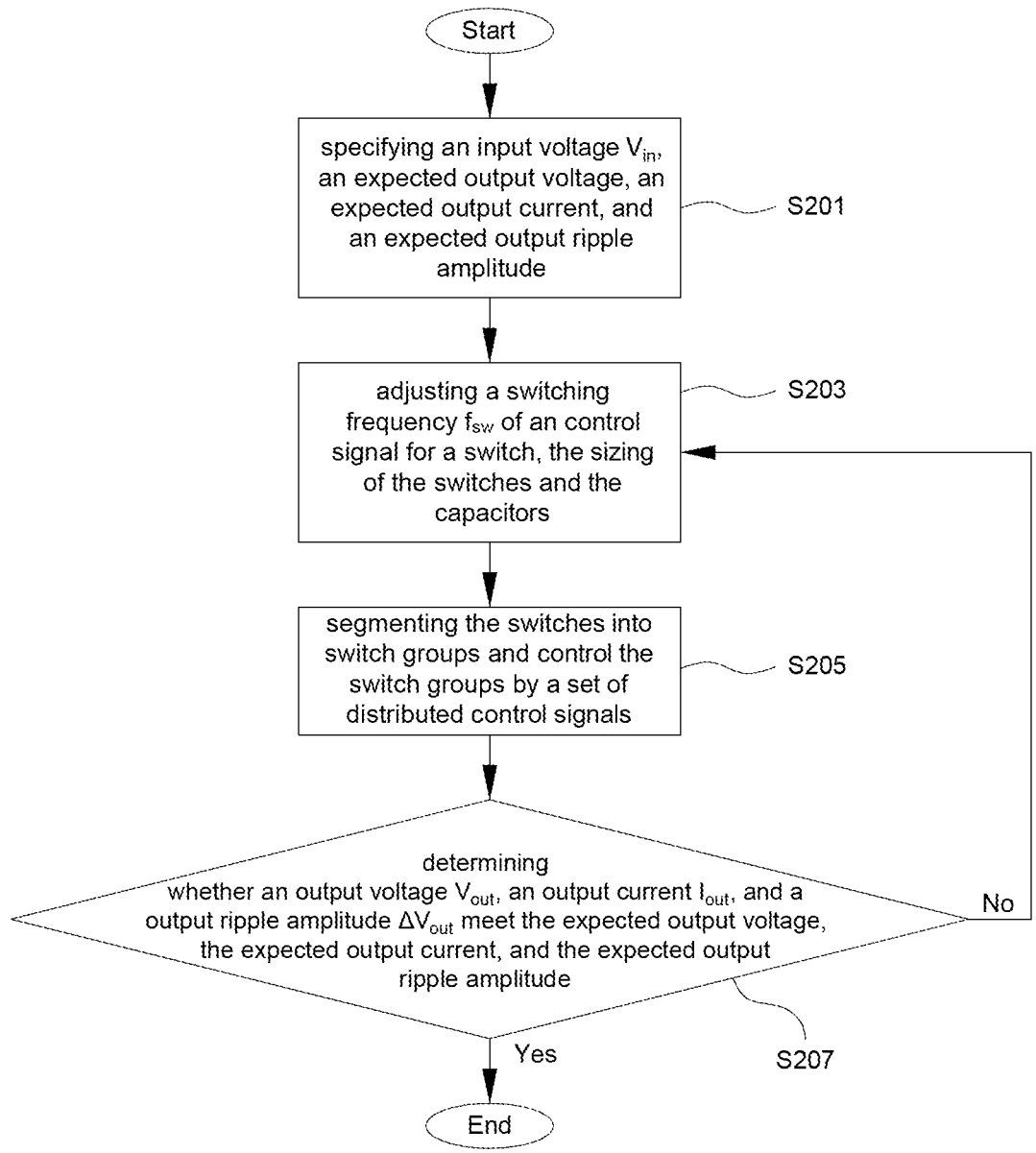
FIG. 2A is a flow chart illustrating a design method of a switched-capacitor DC-DC voltage converter in accordance with some embodiments of the present disclosure.

In order to reduce the output ripple of the switched-capacitor DC/DC voltage converter more efficiently, the present invention provides a design method of a switched-capacitor DC-DC voltage converter in accordance with some embodiments of the present disclosure. Referring to FIG. 2A. FIG. 2A is a flow chart illustrating a design method of a switched-capacitor DC-DC voltage converter in accordance with some embodiments of the present disclosure. The steps of design method of a switched-capacitor DC-DC voltage converter in accordance with some embodiments of the present disclosure comprise specifying an input voltage $V_{in}$, an expected output voltage, an expected output current, and an expected output ripple amplitude (S201); adjusting a switching frequency $f_{sw}$ of an control signal for a switch, the sizing of the switches and the capacitors (S203); segmenting the switches into switch groups and control the switch groups by a set of distributed control signals (S205); and determining whether an output voltage $V_{out}$, an output current $I_{out}$, and a output ripple amplitude $\Delta V_{out}$ meet the expected output voltage, the expected output current, and the expected output ripple amplitude (S207). If the judgment is no, the adjustment of the switching frequency $f_{sw}$ of the control signal for the switch, the sizing of the switches and the capacitors (S203) and the segmentation of the switches into switch groups and the control of the switch groups by a set of distributed control signals (S205) are repeated until judged as yes.

Figure 2B:
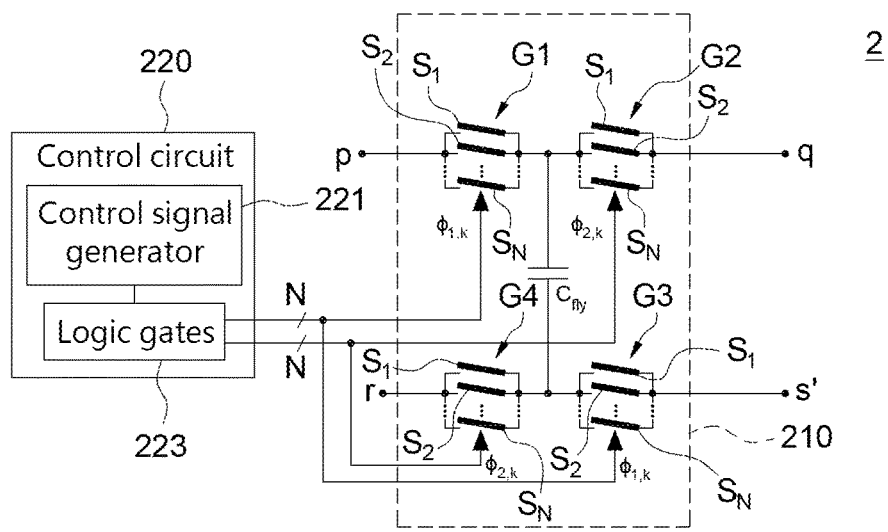
FIG. 2B is a circuit diagram illustrating the switched-capacitor DC-DC voltage converter in accordance with some embodiments of the present disclosure.

The following will specifically describe how the distributed control signal controls the switch array. Referring to FIG. 2B, FIG. 2B is a circuit diagram illustrating the switched-capacitor DC-DC voltage converter in accordance with some embodiments of the present disclosure. As shown in FIG. 2B, the switched-capacitor DC-DC voltage converter 2 comprises at least one switch array 210 and a control circuit 220. The switch array 210 has substantially the same circuit as the switch circuit 10 of the conventional switched-capacitor DC/DC voltage converter 1. The main difference between the two is at least one switch of the switch array 210 is composed of a plurality of power switches obtained by segmenting a single switch of the conventional switch circuit 10, wherein the plurality of power switches are connected to in parallel one another, and the control circuit 220 generates a distributed clock control signal set to control the switch array 210.

More specifically, the switch array 210 comprises a capacitor $C_{fly}$ and at least one switch group. For example, the switch array 210 comprises one switch group and a single switch. According to one embodiment, the switch array 210 comprise four switch groups, a first switch group G1, a second switch group G2, a third switch group G3, and a fourth switch group G4. Each of the first switch group G1, the second switch group G2, the switch group G3, and the fourth switch group G4 comprises a plurality of power switches. For example, each switch group comprises the same number (for example, N) of power switches S1, S2, . . . , SN in parallel, but not limited to this, but each switch group also can comprises a different number of switches.

For those familiar with the field of switched-capacitor DC/DC converter, to produce different switched-capacitor DC/DC voltage converters with different conversion ratios, four terminals of the switch array 210 (comprising a first terminal p being the terminal of the first switch group G1 not connected to the capacitor $C_{fly}$, a second terminal q being the terminal of the second switch group G2 not connected to the capacitor $C_{fly}$, a third terminal r being the terminal of the fourth switch group G4 not connected to the capacitor $C_{fly}$, and a fourth terminal s' being the terminal of the third switch group G3 not connected to the capacitor $C_{fly}$) can be connected with other switch arrays or electrically connected to an input voltage, an output voltage, and a ground as shown in FIGS. 1D-1G. For different switched-capacitor DC/DC voltage converters with different conversion ratios, those familiar with this field should be able to simply assign multiple switch groups into switch groups controlled by the first clock control signal set $\phi_{1,k}$ and switch groups controlled by the second clock control signal set $\phi_{2,k}$.

More specifically, the plurality of power switches $S_1, S_2, \ldots, S_N$ of the first switch group G1 have a first common terminal and a second common terminal, the plurality of power switches $S_1, S_2, \ldots, S_N$ of the second switch group G2 have a first common terminal and a second common terminal, the plurality of power switches $S_1, S_2, \ldots, S_N$ of the third switch group G3 have a first common terminal and a second common terminal, and the plurality of power switches $S_1, S_2, \ldots, S_N$ of the fourth switch group G4 have a first common terminal and a second common terminal. One terminal of the capacitor $C_{fly}$ is electrically connected to the first common terminal of the first switch group G1 and the first common terminal of the second switch group G2, and anther terminal of the capacitor $C_{fly}$ is electrically connected to the first common terminal of the third switch group G3 and the first common terminal of the fourth switch group G4. The second common terminal of the first switch group G1 is the first terminal p of the switch array 210. The second common terminal of the second switch group G2 is the second terminal q of the switch array 210. The second common terminal of the fourth switch group G4 is the third terminal r of the switch array 210. The second common terminal of the third switch group G3 is the fourth terminal s' of the switch array 210.

The control circuit 220 may comprise a control signal generator 221 and logic gates 223. In one embodiment, the control circuit 220 may comprise logic gates 223 and be connected to a control signal generator 221 outside the control circuit 220. The control signal generator 221 can generate a control signal (for example, a square wave, a triangle wave or a sine wave signal) to the logic gates 223. The logic gates 223 can convert the control signal into a first control signal set $\phi_{1,k}$ and a second control signal set $\phi_{2,k}$, and output the first control signal set $\phi_{1,k}$ to the first and third switch groups G1, G3 and the second control signal set $\phi_{2,k}$ to the second and fourth switch groups G2, G4. In which, $k=\{x|0\leq x\leq N-1, x\in Z\}$.

The first control signal set $\phi_{1,k}$ comprises a plurality of control signals $\phi_{1,0}, \phi_{1,1}, \ldots, \phi_{1,N-1}$ with the phase delayed sequentially and the duty cycle reduced sequentially. The second control signal set $\phi_{2,k}$ comprises a plurality of control signals $\phi_{2,0}, \phi_{2,1}, \ldots, \phi_{2,N-1}$ with the phase delayed sequentially and the duty cycle reduced sequentially. The first main clock control signal $\phi_{1,0}$ of the first control signal set $\phi_{1,k}$ and the second main clock control signal $\phi_{2,0}$ of the second control signal set $\phi_{2,k}$ are reverse phase signals or independent signals.

Figure 2C:
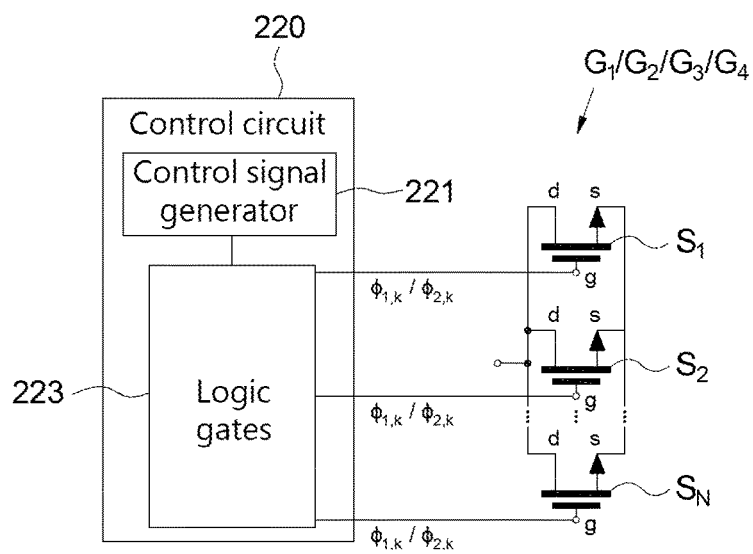
FIG. 2C is a partial circuit diagram illustrating the switched-capacitor DC-DC voltage converter in accordance with some embodiments of the present disclosure.

Next, embodiments of multiple power switches $S_1, S_2, \ldots, S_N$ will be further described. Referring to FIG. 2C, FIG. 2C is a partial circuit diagram illustrating the switched-capacitor DC-DC voltage converter in accordance with some embodiments of the present disclosure. Since the connection relationship between each switch group G1/G2/G3/G4 and the control circuit 220 is the same, and the control circuit 220 can at least control one of the switch groups G1, G2, G3, G4, FIG. 2C only illustrates one of the switch groups G1, G2, G3, G4. According to one embodiment, the plurality of power switches $S_1, S_2, \ldots, S_N$ can have the same sizing ratio W/L or the same area, but not limited to this. According to one embodiment, the sizing ratio of the conventional switch SW1/SW2/SW3/SW4 can be the same as or N times the sizing ratio of the power switches $S1, S2, \ldots, SN$ of the switch group G1/G2/G3/G4, but not limited to this. The plurality of power switches $S_1, S_2, \ldots, S_N$ may be N-type metal-oxide-semiconductor field effect transistors or P-type metal-oxide-semiconductor field effect transistors. FIG. 2C only illustrates N-type metal-oxide-semiconductor field effect transistors, but not limited to this.

According to one embodiment, source terminals s of the plurality of power switches $S_1, S_2, \ldots, S_N$ are electrically connected to one another, and drain terminals d of the plurality of power switches $S_1, S_2, \ldots, S_N$ are electrically connected to one another. The logic gates 223 output the first control signal set $\phi_{1,k}$ to the gate terminals g of the power switches $S_1, S_2, \ldots, S_N$ of the first switch group G1, respectively, and generally synchronously outputs the first control signal set $\phi_{1,k}$ to the gates g of the power switches $S_1, S_2, \ldots, S_N$ of the third switch group G3, respectively, in which the control signals $\phi_{1,0}, \phi_{1,1}, \ldots, \phi_{1,N-1}$ of the first control signal set $\phi_{1,k}$ have a one-to-one relationship with the plurality of power switches $S_1, S_2, \ldots, S_N$. According to one embodiment, sources of the plurality of power switches $S_1, S_2, \ldots, S_N$ are electrically connected to one another, and drains of the plurality of power switches $S_1, S_2, \ldots, S_N$ are electrically connected to one another. The logic gates 223 output the first control signal set $\phi_{1,k}$ to the gates g of the power switches $S_1, S_2, \ldots, S_N$ of the first switch group G1, respectively, and generally synchronously outputs the first control signal set $\phi_{1,k}$ to the gates g of the power switches $S_1, S_2, S_N$ of the third switch group G3, respectively, in which the control signals $\phi_{1,0}, \phi_{1,1}, \ldots, \phi 1, N-1$ of the first control signal set $\phi_{1,k}$ have a one-to-one relationship with the plurality of power switches $S_1, S_2, \ldots, S_N$.

According to one embodiment, the capacitor is a total flying capacitance, but not limited to this.

Figure 2D:
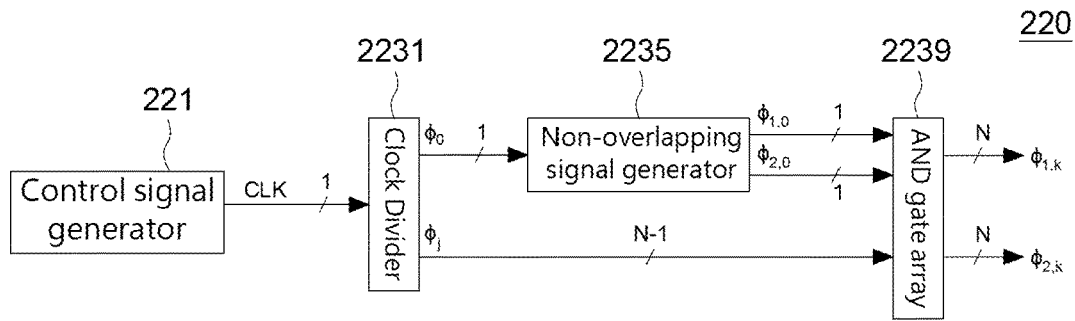
FIG. 2D is a block diagram illustrating a control circuit of the switched-capacitor DC-DC voltage converter in accordance with some embodiments of the present disclosure.

In conjunction with FIG. 2B and FIG. 2C, referring to FIG. 2D, FIG. 2D is a block diagram illustrating a control circuit of the switched-capacitor DC-DC voltage converter in accordance with some embodiments of the present disclosure. The control circuit 220 comprises the control signal generator 221 and the logic gates 223, and the control signal generator 221 outputs a control signal CLK to the logic gates 223. The logic gates 223 comprises a clock divider 2231, a non-overlapping signal generator 2235, and an AND gate array 2239.

The clock divider 2231 divides the control signal CLK into N control signals with equal phase difference, comprising a first clock signal $\phi_0$ and N−1 control signals $\phi_j$ with equal phase difference. The clock divider 2231 outputs the first clock signal $\phi_0$ to the non-overlapping signal generator 2235 and outputs the N−1 control signals $\phi_j$ with equal phase difference to the AND gate array 2239, in which $j=\{x\pi/N|1\leq x\leq N-1, x\in N\}$.

Figure 2E:
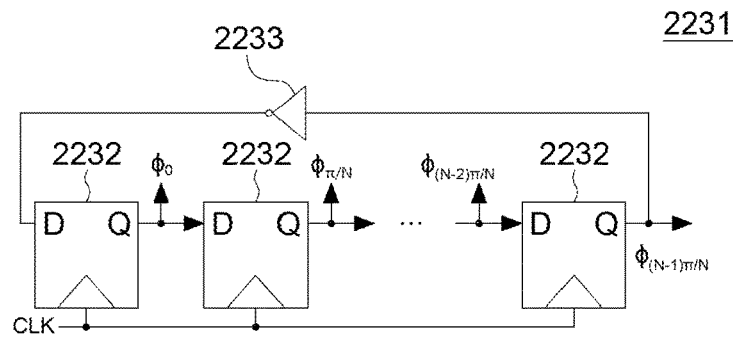
FIG. 2E is a block diagram illustrating a clock divider of the switched-capacitor DC-DC voltage converter in accordance with some embodiments of the present disclosure.
Figure 2F:
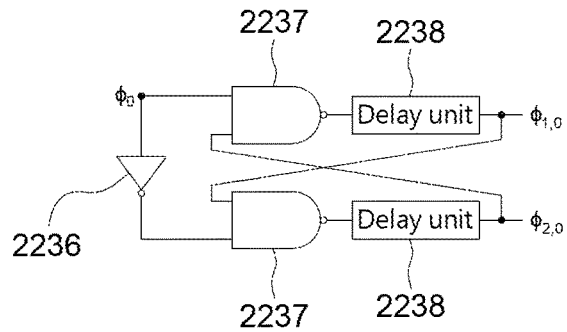
FIG. 2F is a block diagram illustrating a clock divider of the switched-capacitor DC-DC voltage converter in accordance with some embodiments of the present disclosure.

According to one embodiment, the clock divider 2231 may be shown in FIG. 2E. The clock divider 2231 comprises N flip-flops 2232 and an inverter 2233. Each of flip-flops 2232 may be a D-type flip-flop, and all D-type flip-flops are cascaded in series such that the D terminal of one of the flip-flops 2232 and the Q terminal of another adjacent flip-flop are electrically connected as a queue, but not limited to this. The input and output of the inverter are connected to the Q and D terminals of the D-type flip-flops at the end and start of the D-type flip-flop queue, respectively.

The non-overlapping signal generator 2235 converts the first clock signal $\phi_0$ into two positive half-periods and non-overlapping first main control signal $\phi_{1,0}$ and the second main control signal $\phi_{2,0}$, so that the first main control signal $\phi_{1,0}$ and the second main control signal $\phi_{2,0}$ are mutually inverted signals or independent signals.

According to one embodiment, the non-overlapping signal generator 2235 may comprises an inverter 2236, two inverters 2237, and two delay units 2238 as shown in FIG. 2E, but it is not limited to this.

The AND gate array 2239 converts the first main control signal $\phi_{1,0}$ and the N−1 control signals $\phi_j$ with equal phase difference into the first control signal set $\phi_{1,k}$, and converts the second main control signal $\phi_{2,0}$ and the N−1 control signals $\phi_j$ with equal phase difference into the second control signal set $\phi_{2,k}$.

Figure 2G:
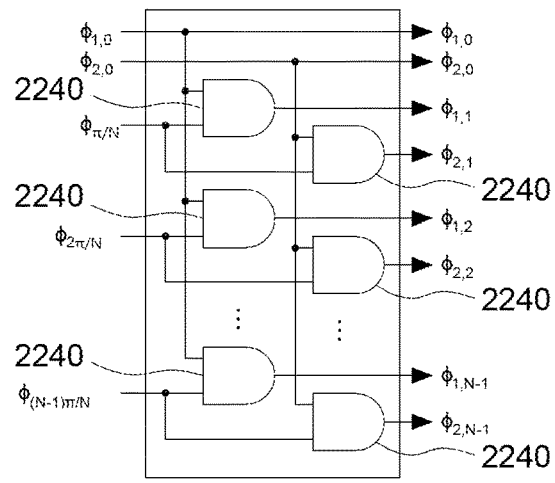
FIG. 2G is a block diagram illustrating an AND gate array of the switched-capacitor DC-DC voltage converter in accordance with some embodiments of the present disclosure.

According to one embodiment, the AND gate array 2239 may be shown in FIG. 2G, and the AND gate array 2239 comprises 2(N−1) AND gates 2240, but it is not limited to this.

Figure 2H:
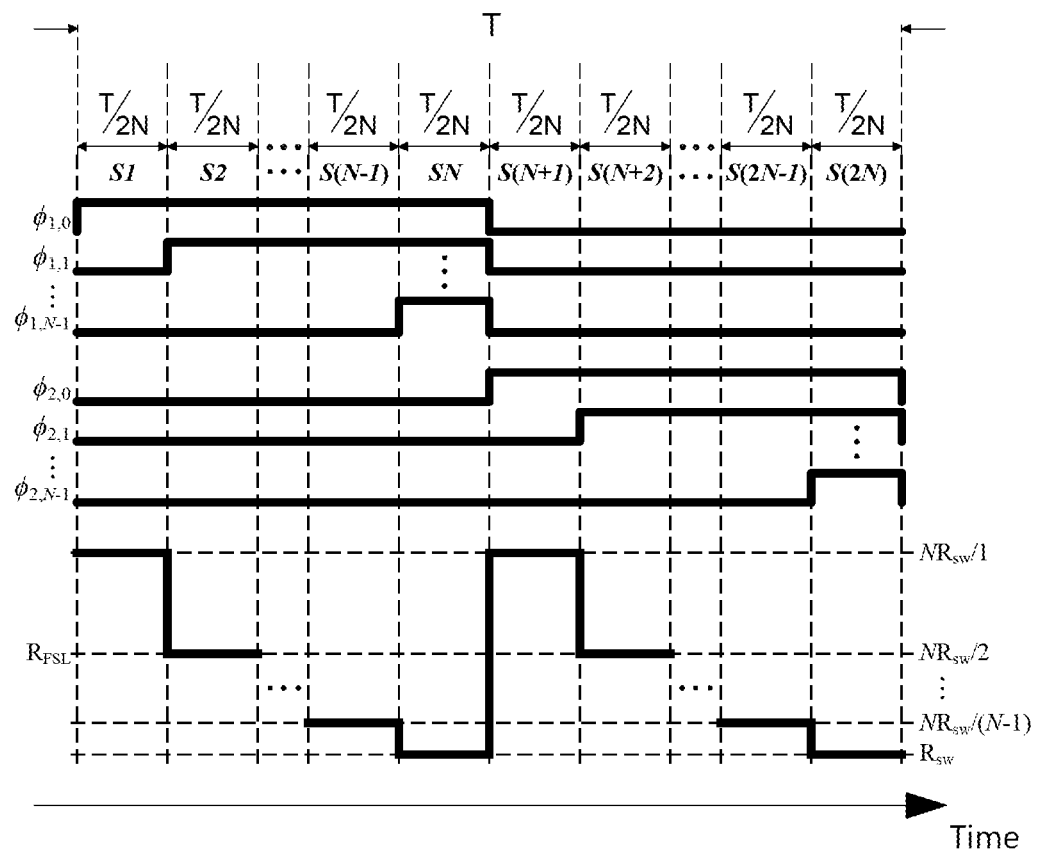
FIG. 2H is a timing diagram illustrating clock control signals and an equivalent resistance of the switched-capacitor DC-DC voltage converter in accordance with some embodiments of the present disclosure.
Figure 2I:
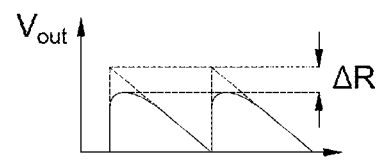
FIG. 2I is a timing diagram illustrating an output voltage of the switched-capacitor DC-DC voltage converter in accordance with some embodiments of the present disclosure.

With the above design and arrangement, the phases of the first and second control signal sets $\phi_{1,k}$, $\phi_{2,k}$ are delayed in sequence by ½N cycle time T, respectively, and the duty cycles of the first and second control signal sets $\phi_{1,k}$, $\phi_{2,k}$ are reduced in sequence by 1/N duty cycle T/2 (as shown in FIG. 2H), such that an equivalent resistance $R_{FSL}$ of switch groups G1, G2, G3, G4 changes periodically according to the number of power switches $S_1, S_2, \ldots, S_N$ (as shown in FIG. 2G, from $N_{RSW}/1$, $N_{RSW}/2$, $N_{RSW}/3$ to $R_{SW}$ in sequence, $R_{SW}$ is the equivalent resistance of the conventional single power switches S1, S2, S3, S4, and the area of the power switch S1 is the sum of the area of the power switches $S_1, S_2, \ldots, S_N$). With the above behaviors, the output ripple amplitude $\Delta V_{out}$ on the output load unit $R_{L1}$ is reduced (the ripple reduction amplitude $\Delta R$ is marked as shown in FIG. 2I).

In summary, the switched-capacitor DC/DC voltage converter and the control method disclosed in the present invention have low output ripple, and the voltage conversion circuit maintains a conventional simple structure and reduced cost. The control signal of the control circuit can be generated by the existing interleaved clock signal with simple logic gates, thereby reducing the production complexity. The control characteristics are scalable, and can be applied to a wide range of interleaved control stages after being stacked number. In addition, the switched-capacitor DC/DC voltage converter and its control method disclosed in the present invention only modulate the charging and discharging process of the voltage conversion circuit in an open-loop manner, so it is compatible with the existing closed-loop ripple reduction technology.

While various embodiments in accordance with the disclosed principles are described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A switched-capacitor DC-DC voltage converter, comprising:
    at least one switch array, comprising a capacitor, a first switch group, a second switch group, a third switch group, and a fourth switch group, wherein each of the first, second, third, and fourth switch groups comprises a plurality of power switches connected to one another in parallel, one end of the capacitor is electrically connected to the first switch group and the second switch group, another end of the capacitor is electrically connected to the third switch group and the fourth switch group; and
    a control circuit, converting an input control signal into a first control signal set and a second control signal set, and outputting the first control signal set to the first and third switch groups, and outputting the second control signal set to the second and fourth switch groups, wherein each of the first control signal set and the second control signal set comprises a plurality of control signals with the phase delayed sequentially and the duty cycle reduced sequentially.

2. The switched-capacitor DC-DC voltage converter according to claim 1, wherein the power switches have the same area.

3. The switched-capacitor DC-DC voltage converter according to claim 1, wherein the power switches are field effect transistors.

4. The switched-capacitor DC-DC voltage converter according to claim 1, wherein the power switches have the same sizing ratio.

5. The switched-capacitor DC-DC voltage converter according to claim 1, wherein the number of the power switches of each of the first, second, third, and fourth switch groups is N, and the control circuit comprising:
    a clock divider, dividing the control signal into N control signals with equal phase difference, comprising a first clock signal and N−1 control signals with equal phase difference;
    a non-overlapping signal generator, converting the first clock signal into a first main clock control signal and a second main clock control signal;
    an AND gate array, converting the first main clock control signal and the N−1 control signals with equal phase difference into the first control signal set, and converting the second main clock control signal and the N−1 control signals with equal phase difference into the second control signal set.

6. The switched-capacitor DC-DC voltage converter according to claim 5, wherein the clock divider comprises N flip-flops and an inverter.

7. The switched-capacitor DC-DC voltage converter according to claim 5, wherein the non-overlapping signal generator comprises an inverter, two NAND gates, and two delay units.

8. The switched-capacitor DC-DC voltage converter according to claim 5, wherein the AND gate array comprises 2(N−1) AND gates.

9. The switched-capacitor DC-DC voltage converter according to claim 1, wherein the number of the power switches of each of the first, second, third, and fourth switch groups is N, and a delay time of each of the first and second control signal sets is ½N cycle time.

10. The switched-capacitor DC-DC voltage converter according to claim 1, wherein the number of the power switches of each of the first, second, third, and fourth switch groups is N, and duty cycles of each of the first and second control signal sets are sequentially reduced by 1/N duty cycle.

11. A control method of a switched-capacitor DC-DC voltage converter, wherein at least one switch array in the switched-capacitor DC-DC voltage converter is controlled by a control circuit, the switch array comprises a capacitor, a first switch group, a second switch group, a third switch group, and a fourth switch group, each of the first, second, third, and fourth switch groups comprises a plurality of power switches connected to one another in parallel, one end of the capacitor is electrically connected to the first switch group and the second switch group, another end of the capacitor is electrically connected to the third switch group and the fourth switch group, and the method comprising:
converting an input control signal into a first control signal set and a second control signal set;
outputting the first control signal set to the first and third switch groups, and outputting the second control signal set to the second and fourth discharge switch groups,
wherein each of the first control signal set and the second control signal set comprises a plurality of control signals with phase delayed sequentially and the duty cycle reduced sequentially.

12. The method according to claim 11, wherein the number of the power switches of each of the first, second, third, and fourth switch groups is N, and the step of transferring the control signal to the first control signal set and the second control signal set comprising:
a clock divider, dividing the control signal into a first clock signal and N−1 control signals with equal phase difference;
a non-overlapping signal generator, converting the first clock signal into a first main clock control signal and a second main clock control signal;
an AND gate array, converting the first main clock control signal and the N−1 control signals with equal phase difference into the first control signal set, and converting the second main clock control signal and the N−1 control signals with equal phase difference into the second control signal set.

13. The method according to claim 11, wherein the number of the power switches of each of the first, second, third, and fourth switch groups is N, and a delay time of each of the first and second control signal sets is ½N cycle time.

14. The method according to claim 11, wherein the number of the power switches of each of the first, second, third, and fourth switch groups is N, and duty cycles of each of the first and second control signal sets are sequentially reduced by 1/N duty cycle.

15. A switched-capacitor DC-DC voltage converter, comprising:
at least one switch array, comprising a capacitor and at least one switch group, wherein the switch group comprises a plurality of power switches connected to one another in parallel, and one end of the capacitor is electrically connected to the switch group; and
a control circuit, converting an input control signal into a control signal set, and outputting the control signal set to the switch group, and the control signal set comprises a plurality of signals with phase delayed sequentially and the duty cycle reduced sequentially.

16. A control method of a switched-capacitor DC-DC voltage converter, wherein at least one switch array in the switched-capacitor DC-DC voltage converter is controlled by a control circuit, the switch array comprises a capacitor, and at least one switch group, wherein the switch group comprises a plurality of power switches connected to one another in parallel, and one end of the capacitor is electrically connected to the switch group, and the method comprising:
converting an input control signal into a control signal set; and
outputting the control signal set to the switch group,
wherein the control signal set comprises a plurality of signals with phase delayed sequentially and the duty cycle reduced sequentially.

* * * * *